(12) United States Patent
Brown

(10) Patent No.: US 6,275,293 B1
(45) Date of Patent: Aug. 14, 2001

(54) METHOD FOR MEASUREMENT OF OSF DENSITY

(75) Inventor: Timothy L. Brown, Vancouver, WA (US)

(73) Assignee: SEH America, Inc., Vancouver, WA (US)

(*) Notice: Subject to any disclaimer, the term of this patent is extended or adjusted under 35 U.S.C. 154(b) by 0 days.

(21) Appl. No.: 09/569,354

(22) Filed: May 10, 2000

(51) Int. Cl.[7] .................................................. G01B 11/30
(52) U.S. Cl. ...................................... 356/371; 356/30
(58) Field of Search ........................ 356/371, 237.1, 356/237.2, 237.3, 237.4, 237.5, 445, 446, 448, 30, 31; 117/213, 900, 932; 438/507, 172, 312

(56) References Cited

U.S. PATENT DOCUMENTS

| | | | |
|---|---|---|---|
| 4,981,549 * | 1/1991 | Yamashita et al. | 156/620.4 |
| 5,298,963 * | 3/1994 | Moriya et al. | 356/31 |
| 5,373,804 * | 12/1994 | Tachimori et al. | 117/13 |
| 5,508,800 * | 4/1996 | Miyashita et al. | 356/30 |
| 5,677,208 * | 10/1997 | Itou et al. | 437/29 |
| 5,730,800 * | 3/1998 | Sato et al. | 118/200 |
| 5,903,342 * | 5/1999 | Yatsugake et al. | 356/237.4 |
| 5,933,229 * | 8/1999 | Yeh et al. | 356/445 |
| 6,190,452 * | 2/2001 | Sakurada et al. | 117/20 |

FOREIGN PATENT DOCUMENTS 0702204   11/1999   (EP) .

* cited by examiner

*Primary Examiner*—Hoa Q. Pham
(74) *Attorney, Agent, or Firm*—Kurt M. Rylander

(57) ABSTRACT

A novel automated method for measuring oxygen stacking fault density on silicon wafers using methods for measuring surface roughness of a silicon wafer. A silicon wafer manufactured according to processes that include the novel automated method for measuring oxygen stacking fault density on silicon wafers using methods for measuring surface roughness of a silicon wafer.

7 Claims, 1 Drawing Sheet

Fig. 2   OSF RING ON N2 DOPED WAFERS

METHOD FOR MEASUREMENT OF OSF DENSITY

FIELD OF THE INVENTION

The instant invention relates to methods of evaluating silicon wafers and more particularly to a method of evaluating the OSF density on the surface of a silicon wafer.

BACKGROUND

Oxygen induced stacking faults (OSF) occur in the manufacture of silicon wafers. Measuring the OSF density is necessary for quality control in the manufacture of silicon wafers. Silicon wafers are used throughout industry, including by manufacturers of memory devices and microprocessors.

Known methods of measuring OSF density are limited to visual inspection by manufacturing operators. Visual inspection includes irradiating the surface of an oxidized and etched silicon wafer with a halogen lamp, spotting areas of haziness on the wafer, and measuring density with an optical microscope, either by photographing the location or directly through the optical microscope eyepiece, by counting the visible faults and multiplying by a factor based on magnification and area of image to determine density. Disadvantages of existing methods of measuring OSF density include the susceptibility to human error in visual inspection, the slowness of visual inspection by operators, and the lack of uniformity of visual inspection between operators. Other disadvantages include the need for a separate step in the manufacturing process for the visual inspection.

Heretofore, application of methods and articles for measuring OSF density by correlation to surface roughness measurement has never been performed. A method of measuring OSF density using methods and articles for measuring surface roughness of silicon wafers has never been performed. An automated method for measuring OSF density has never been performed. An automated method of measuring OSF density that does not rely on visual inspection by operators has never been performed. A method of measuring OSF density that uses existing inspection methods heretofore applied in other areas of inspection has never been performed.

EP 0702204 B1 (Aihara, et al) discloses a method of evaluating the crystal quality near the surface of a silicon wafer through microroughness analysis. The patent describes a relationship between microroughness and crystal quality and teaches that detection of the high sensitivity changes in the surface configuration of a silicon wafer provides a method of evaluating the crystal quality of silicon wafers. The invention defines crystal quality as "the surface configuration between each silicon crystal." The patent discloses that a method for evaluating crystal quality through microroughness analysis will replace the evaluation method of measuring dielectric breakdown voltage of an oxide layer. The patent neither identifies OSF density, nor relates crystal quality to OSF density. As such, the patent teaches away from the use of surface roughness measurement as a means to measure OSF density. The patent does not disclose replacement of the OSF density inspection quality control process.

Therefore, it is highly desirable to create an automated method of measuring OSF density. It is further highly desirable for creating a method of measuring OSF density that does not rely on visual inspection. It is also highly desirable to create a method of measuring OSF density that utilizes existing inspection methods heretofore applied in other areas of inspection. Potential customers for methods that meet these objects include silicon wafer manufacturers, memory and microprocessor manufacturers—any manufacturer that uses silicon wafers and has a need to measure OSF density on a wafer.

SUMMARY

Accordingly, it is an object to provide novel methods for solving the above-mentioned problems. In particular, it is an object to provide novel automated methods for measuring OSF density in silicon wafers. It is an object to provide novel methods for measuring OSF density that do not rely on visual inspection. It is an object to provide novel methods of measuring OSF density that utilize existing inspection methods heretofore applied in other areas of inspection.

These and other objects and advantages are achieved by methods for automating the OSF density measurement process and by eliminating or reducing the need for visual inspection of OSF density.

The novel methods provide a number of advantages, including automation of methods for measuring OSF density, elimination or reduction of visual inspection and its inherent operator variation as a method of measuring OSF density, faster OSF density measurement, and reduction of cost of measuring OSF density. The novel methods also provide for more reliable and uniform OSF density measurement.

The methods are compatible with techniques for surface roughness measurement of silicon wafers. Commercially available equipment may be used.

The novel methods of the invention are well suited for use in connection with manufacturing silicon wafers. The methods allow automated measurement of OSF density without the aid of visual inspection by using methods of measuring surface roughness. In such uses the surface measurements are performed on the silicon wafers with surface measurement machines and the resulting data is multiplied by a predetermined correlation factor to determine the OSF density of the silicon wafer.

The embodiments of the invention utilize automated methods for measuring surface roughness on a silicon wafer to determine OSF density on wafers. In the preferred embodiment, the described invention utilizes a texture measurement machine to measure surface roughness on a polished silicon wafer surface to determine OSF density on wafers previously oxidized and etched. This described invention is not limited to use on a wafer from any specific phase of silicon wafer manufacturing, but wafers must be oxidized and etched before OSF density is measured using surface roughness.

Further benefits and advantages of the embodiments of the invention will become apparent from consideration of the following detailed description given with reference to the accompanying drawings, which specify and show preferred embodiments of the present invention.

BRIEF DESCRIPTION OF THE DRAWINGS

FIG. 2 depicts an exemplary OSF Ring on Nitrogen (N2) doped wafers, Wafer ID No. 2412C047 with surface roughness correlating to OSF density.

DETAILED DESCRIPTION

Figure 1:
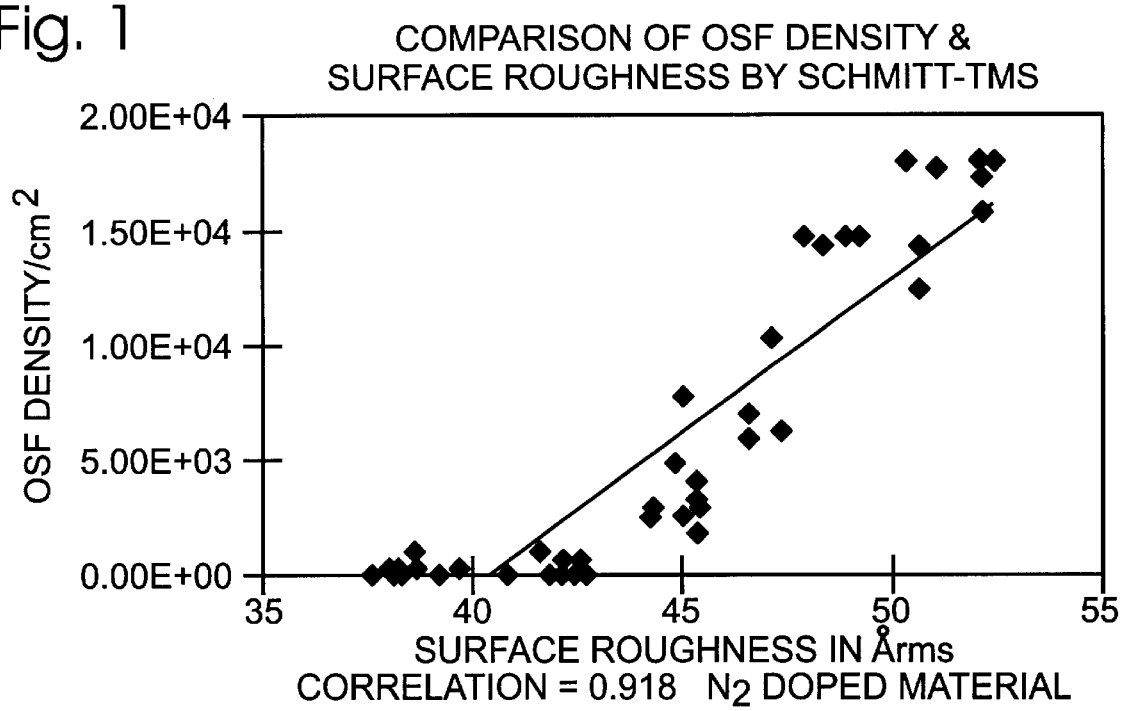
FIG. 1 is a graph showing the correlation of surface roughness to OSF density.
Figure 1:
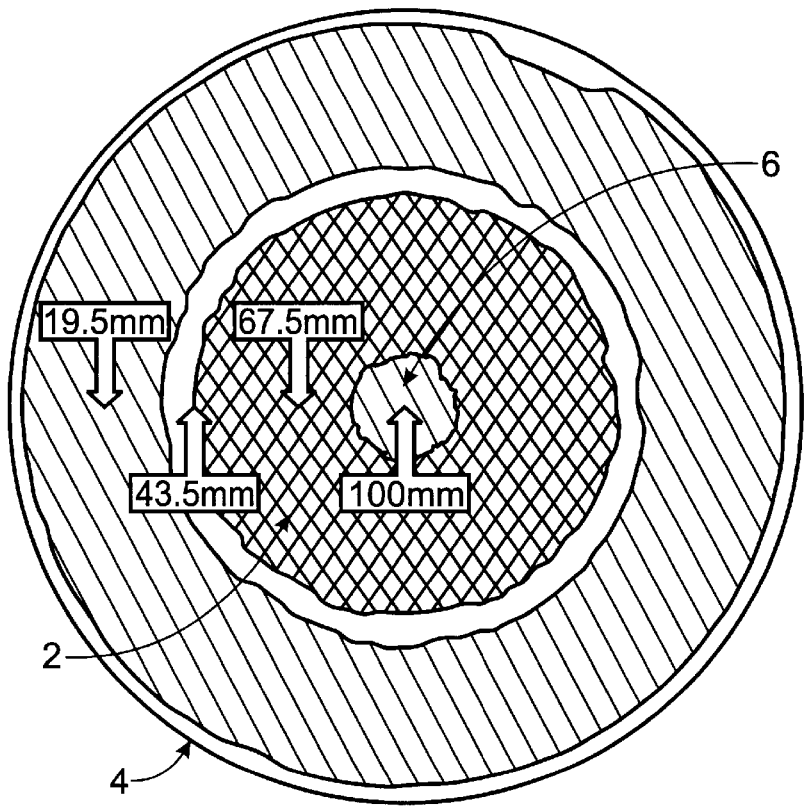

The invention provides novel methods for measuring OSF density on silicon wafers. The invention discloses a method for measuring OSF density comprising the steps of preparing a silicon wafer for measurement by oxidizing and etching said silicon wafer, measuring the surface roughness of said silicon wafer, and determining the OSF density of said silicon wafer by multiplying the surface roughness measurement by a predetermined correlation factor. The invention discloses an article of manufacture comprising manufactured silicon wafers wherein the final silicon wafers are chosen from silicon wafers that have been measured for OSF density using the disclosed method of measuring OSF density.

The manufacture of silicon wafers includes the processes for lapping, etching, heat treating, oxidation, polishing, and quality control, among others. Quality control processes include OSF density inspection and surface roughness measurement.

Methods that measure surface roughness of silicon wafers are described in EP 0702204 B 1 (Aihara, et al), U.S. Pat. No. 5,661,556 (Schiff, et al), U.S. Pat. No. 5625451 (Schiff, et al). Schmitt Measurement Systems, Inc., 2765 N.W. Nicolai Street, Portland, Oreg. 97210 sells commerically available texture measurement machines adapted to measuring surface roughness on a silicon wafer, including the TMS-2000 Texture Measurement System, the TMS-2000W Texture Measurement System, the TMS-3000W Surface Roughness Measurement System, and the DTM 2000 Dual Texture Measurement System.

Research reveals the direct correlation between surface roughness and OSF density on silicon wafers. FIG. 2 displays an exemplary silicon wafer with an OSF density ring (2) between the seed position (6) of the silicon wafer and the edge of the silicon wafer (4) localized around the 67.5 mm position from the edge of the silicon wafer (4) with darker shading representing greater surface roughness as measured in Angstroms. Table 1 tabulates the experimental data taken from a random sampling of discrete measurement locations on Nitrogen doped silicon wafers in manufacture, revealing the direct correlation between surface roughness and OSF density.

TABLE 1

| Measurement Number(i = 1 to n) | Surface Roughness in Angstroms | OSF Density/cm2 |
| --- | --- | --- |
| 1 | 41.62 | 1.10E + 03 |
| 2 | 44.33 | 2.95E + 03 |
| 3 | 50.63 | 1.43E + 04 |
| 4 | 38.02 | 3.69E + 02 |
| 5 | 42.53 | 7.38E + 02 |
| 6 | 44.26 | 2.58E + 03 |
| 7 | 50.34 | 1.80E + 04 |
| 8 | 38.19 | 3.69E + 02 |
| 9 | 42.71 | 0.00E + 00 |
| 10 | 45.36 | 1.84E + 03 |
| 11 | 50.66 | 1.25E + 04 |
| 12 | 39.17 | 0.00E + 00 |
| 13 | 42.17 | 7.38E + 02 |
| 14 | 44.84 | 4.79E + 03 |
| 15 | 51.06 | 1.77E + 04 |
| 16 | 38.62 | 3.69E + 02 |
| 17 | 42.45 | 0.00E + 00 |
| 18 | 45.34 | 3.31E + 03 |
| 19 | 50.17 | 8.48E + 03 |
| 20 | 38.58 | 1.10E + 03 |
| 21 | 52.11 | 1.80E + 04 |
| 22 | 39.68 | 3.69E + 02 |
| 23 | 45.43 | 2.95E + 03 |
| 24 | 52.15 | 1.58E + 04 |
| 25 | 52.15 | 1.73E + 04 |
| 26 | 52.44 | 1.80E + 04 |

TABLE 1-continued

| Measurement Number(i = 1 to n) | Surface Roughness in Angstroms | OSF Density/cm2 |
| --- | --- | --- |
| 27 | 41.84 | 0.00E + 00 |
| 28 | 37.6 | 0.00E + 00 |
| 29 | 45.02 | 7.74E + 03 |
| 30 | 46.6 | 5.90E + 03 |
| 31 | 42.1 | 0.00E + 00 |
| 32 | 40.81 | 0.00E + 00 |
| 33 | 38.24 | 0.00E + 00 |

FIG. 1 displays the correlation graph of the experimental data in Table 1. The direct correlation between surface roughness and OSF density is calculated by the correlation formula as follows where R is the correlation factor, $\chi_i$ is an individual measurement in Angstroms of surface roughness for i=1 to n discrete measurement locations, $\gamma_i$ is a visual inspection of OSF density for i=1 to n discrete measurements locations in terms of OSF/cm$^2$, $\bar{\chi}$ is the average surface roughness measurement for n discrete measurement locations, and $\bar{\gamma}$ is the average OSF density for n discrete measurement locations.

$$R = \frac{\sum_{i=1}^{n}(x_i - \bar{x})(y_i - \bar{y})}{\sqrt{\left(\sum_{i=1}^{n}(x_i - \bar{x})^2\right)\left(\sum_{i=1}^{n}(y_i - \bar{y})^2\right)}}$$

The resulting correlation factor is statistically significant and can be directly used to measure OSF density on wafers by multiplying the correlation factor to measurements of surface roughness. The provided sample data yield a correlation factor of 0.918. The level of precision of R being affected by the operator variation during visual inspection, the correlation factor is within range of 0.918±0.05. Statistically significant correlation factors lower than 0.918 can be chosen for stringency in inspection.

The direct correlation between roughness and OSF density allows methods of measuring surface roughness, such as those disclosed in EP 0702204 B1 (Aihara, et al), U.S. Pat. No. 5661556 (Schiff, et al), U.S. Pat. No. 5,625,451 (Schiff, et al), to be used to measure OSF density at the same time that surface roughness is measured by measuring the surface roughness, and multiplying the predetermined correlation factor to the measurement of surface roughness to determine the OSF density. Surface roughness can be measured at a plurality of points, and the OSF density determined for each point by multiplying the predetermined correlation factor to each surface roughness measurement. A mean OSF density can be determined by taking the average OSF density over the measured points.

The texture measurement machines can be used to measure OSF density by measuring surface roughness and multiplying the predetermined correlation factor to the measurement results to determine the OSF density. The preferred embodiment utilizes a TMS-2000 Texture Measurement System, commercially available from Schmitt Measurement Systems, Inc.

Measurement of OSF density according to the described methods can be performed on a silicon wafer taken from any stage in the manufacturing process but the measurement must be preceded by preparatory oxidation and etch steps which are destructive to the silicon wafer yet necessary processes to measure OSF with surface roughness technology. The preferred embodiment takes the measurement after wafer polishing manufacturing process has been performed. In the preferred embodiment, prior to measurement, the silicon wafer is prepared for measurement by oxidizing the wafer in an oxidation furnace at 1100 degrees Celsius for 100 minutes in a wet oxygen atmosphere, and etching the wafer for 2 minutes using an etchant mixture consisting essentially of acetic acid, hydrofluoric acid, nitric acid, silver nitrate, and copper nitrate as described in U.S. Pat. No. 4787997 (Saito, et al), incorporated herein by reference.

It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are also possible, their specific designs depending upon the particular application. As such, the scope of the invention should not be limited by the particular embodiments herein described but should be defined only by the appended claims and equivalents thereof.

I claim:

1. A method of measuring OSF density comprising the steps of:
   a. preparing a silicon wafer for measurement with the processes of oxidation and etch;
   b. measuring the surface roughness of said silicon wafer; and
   c. multiplying a predetermined correlation factor to said surface roughness measurement to determine the OSF density of said silicon wafer.

2. A method of measuring OSF density comprising the steps of:
   a. preparing a silicon wafer for measurement with the processes of oxidation and etch;
   b. measuring the surface roughness of said silicon wafer at several points; and
   c. multiplying a predetermined correlation factor to said surface roughness measurements to determine the OSF density of said silicon wafer at said measurement points.

3. A method of measuring OSF density as in claim 2, further comprising the step of taking the average OSF density from said OSF densities determined at said measurement points.

4. A method of measuring OSF density as in claims 1, 2, or 3, wherein the step of preparing said silicon wafer for measurement comprises oxidizing said silicon wafer in an oxidation furnace at 1100 degrees Celsius for 100 minutes in a wet oxygen atmosphere and etching said silicon wafer for 2 minutes using an etchant mixture consisting essentially of acetic acid, hydrofluoric acid, nitric acid, silver nitrate, and copper nitrate.

5. A method of measuring OSF density as in claims 1, 2 or 3, wherein the step of measuring the surface roughness of said silicon wafer is performed with a measurement system selected from the group consisting of the TMS-2000 Texture Measurement System, the TMS-2000W Texture Measurement System, the TMS-3000W Surface Roughness Measurement System, and the DTM 2000 Dual Texture Measurement System.

6. A method of measuring OSF density as in claims 1, 2, or 3, wherein the measurements are taken after the polish stage of the manufacturing process.

7. A silicon wafer resulting from silicon wafer manufacture wherein the silicon wafer manufacture includes a quality control process comprising the step of measuring OSF density according to claims 1, 2, or 3.

* * * * *